United States Patent [19]
Kim

[11] Patent Number: 6,081,459
[45] Date of Patent: Jun. 27, 2000

[54] CELL PLATE VOLTAGE GENERATOR OF A SEMICONDUCTOR MEMORY DEVICE

[75] Inventor: Sang Soo Kim, Ichon, Rep. of Korea

[73] Assignee: Hyundai Electronics Industries Co., Ltd., Kyoungki-do, Rep. of Korea

[21] Appl. No.: 09/095,576

[22] Filed: Jun. 11, 1998

[30] Foreign Application Priority Data

Jun. 30, 1997 [KR] Rep. of Korea .................. 97-30225

[51] Int. Cl.⁷ .................................................. G11C 16/04
[52] U.S. Cl. .................. 365/189.09; 365/189.09; 365/149; 365/226; 365/530; 365/534
[58] Field of Search ........................ 365/189.09, 149, 365/226; 327/530, 534

[56] References Cited

U.S. PATENT DOCUMENTS

| | | | |
|---|---|---|---|
| 4,769,784 | 9/1988 | Doluca et al. | 365/149 |
| 4,799,193 | 1/1989 | Horiguchi et al | 365/149 |
| 5,305,270 | 4/1994 | Kim | 365/203 |
| 5,317,532 | 5/1994 | Ochii | 365/149 |
| 5,500,824 | 3/1996 | Fink | 365/201 |
| 5,557,571 | 9/1996 | Kato | 365/189 |
| 5,777,934 | 7/1998 | Lee et al. | 365/203 |

*Primary Examiner*—David Nelms
*Assistant Examiner*—Connie Yoha
*Attorney, Agent, or Firm*—Gary M. Nath; Harold L. Novick; Nath & Associates

[57] ABSTRACT

A cell plate voltage generator of a semiconductor memory device for selectively providing a cell plate potential having various voltages to thereby substantially reduce the time required for a burn-in test includes a half Vdd generation block for producing a half voltage having a half of an external potential inputted from outside of the semiconductor memory device; a Vbb generation block for generating a negative voltage; a cell plate voltage selection block for generating a plurality of control signals; a transmission block having a plurality of transmission circuits for delivering selectively the half voltage, the negative voltage, the source voltage, and the ground voltage in accordance with the control signals; and a level shifter for level shifting at least two of the control signals in order to avert the voltage drop in threshold voltages of the transmission circuits.

6 Claims, 3 Drawing Sheets

CELL PLATE VOLTAGE GENERATOR OF A SEMICONDUCTOR MEMORY DEVICE

FIELD OF THE INVENTION

The present invention relates to a semiconductor memory device; and, more particularly, to a cell plate voltage generator for selectively using a memory cell plate potential of the semiconductor device.

DESCRIPTION OF THE PRIOR ART

In general, a memory cell of a semiconductor device such as a dynamic random access memory(DRAM) is composed of one transistor Q and one capacitor C as shown in FIG. 1.

In FIG. 1, a contact connected on a bit line BL is referred to as a bit line contact and two cells are connected by one contact. There is a word line WL between the bit line contact and a storage node contact. If a positive high voltage is fed to the word line WL, the transistor Q is turned on and, thereafter, the storage node contact and the bit line contact are interconnected.

The storage node contact is attached to one electrode of the cell capacitor C and the other electrode of the cell capacitor C is connected to a voltage node having a voltage Vdd/2. Consequently, an electric charge stored at the cell capacitor can be transferred to the bit line BL.

As can be seen above, the conventional semiconductor device employs a cell plate potential vcp having a half voltage Vdd/2 of an external voltage source Vdd. Therefore, when performing a burn in test on the semiconductor device, although a higher external voltage is provided to the semiconductor device from the outside, a voltage having only hundreds of mV, e.g., 300 mV is fed to the semiconductor device.

As a result, it would result in a long burn-in stress time for a least amount of oxide voltage stress and, thereafter, it results in high cost.

SUMMARY OF THE INVENTION

It is, therefore, a primary object of the present invention to provide a cell plate voltage generator of a semiconductor memory device capable of selectively providing a cell plate potential having various voltages to thereby substantially reduce the time of a burn-in test.

In accordance with the present invention, there is provided a cell plate voltage generator of a semiconductor memory device, comprising: a half Vdd generation block for producing a half voltage having half of an external potential inputted from the outside of the semiconductor memory device; a Vbb generation block for generating a negative voltage; a cell plate voltage selection block for choosing as a cell plate voltage one of the half voltage outputted from the half Vdd generation block, the negative voltage provided from the Vbb generation block, a source voltage Vdd and a ground voltage; and a transmission block for delivering the chosen voltage from the cell plate voltage selection block to a cell plate voltage terminal.

BRIEF DESCRIPTION OF THE DRAWINGS

The foregoing and other objects, features and advantages of the present invention will become apparent from the following detailed description of preferred embodiments of the invention with reference to the accompanying drawings, in which.

DETAILED DESCRIPTION OF THE PREFERRED EMBODIMENTS

The embodiments of the present invention will be illustrated in detail with reference to the accompanying drawings.

Figure 1:
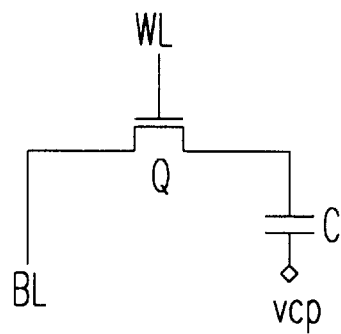
FIG. 1 represents a transistor-cell circuit diagram of a conventional semiconductor memory device.
Figure 2:
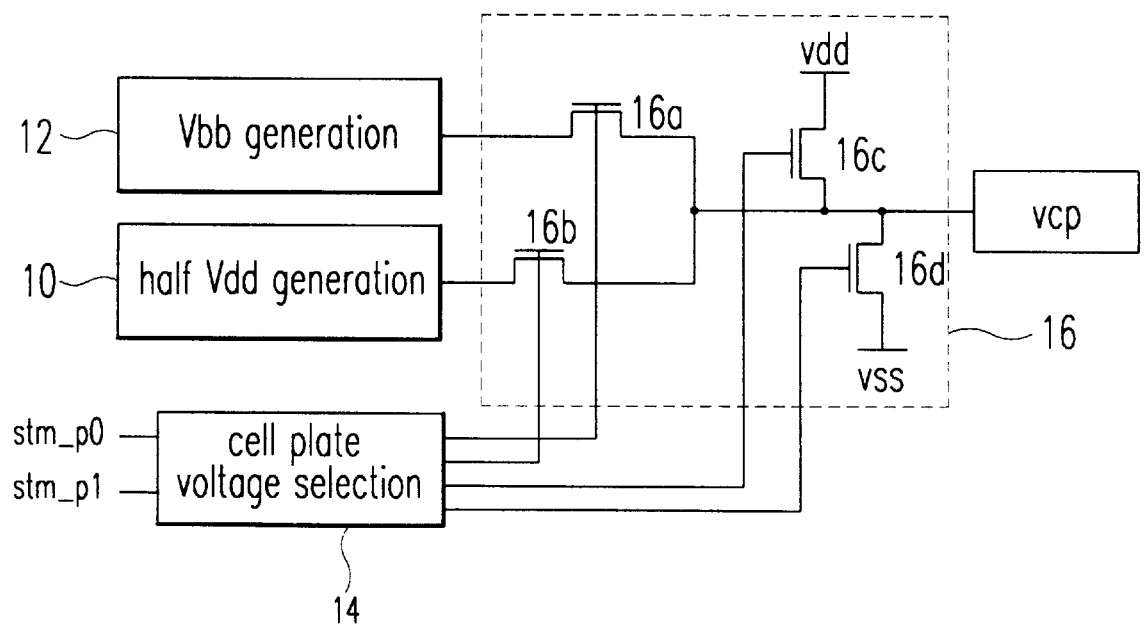
FIG. 2 shows a block diagram of a cell plate voltage generator of a semiconductor memory device in accordance with an embodiment of the present invention.

Referring to FIG. 2, there is provided a block diagram of a cell plate voltage generator in accordance with an embodiment of the present invention. The cell plate voltage generator is composed of a half Vdd generation block 10 for producing a half voltage Vdd/2; a Vbb generation block 12 for generating a negative voltage; a cell plate voltage selection block 14 for choosing one of the half voltage outputted from the half Vdd generation block 10, the negative voltage coupled from the Vbb generation block 12, a source voltage Vdd and a ground voltage Vss as a cell plate voltage; and a transmission block 16 for delivering the selected cell plate voltage to a cell plate voltage terminal.

Figure 3:
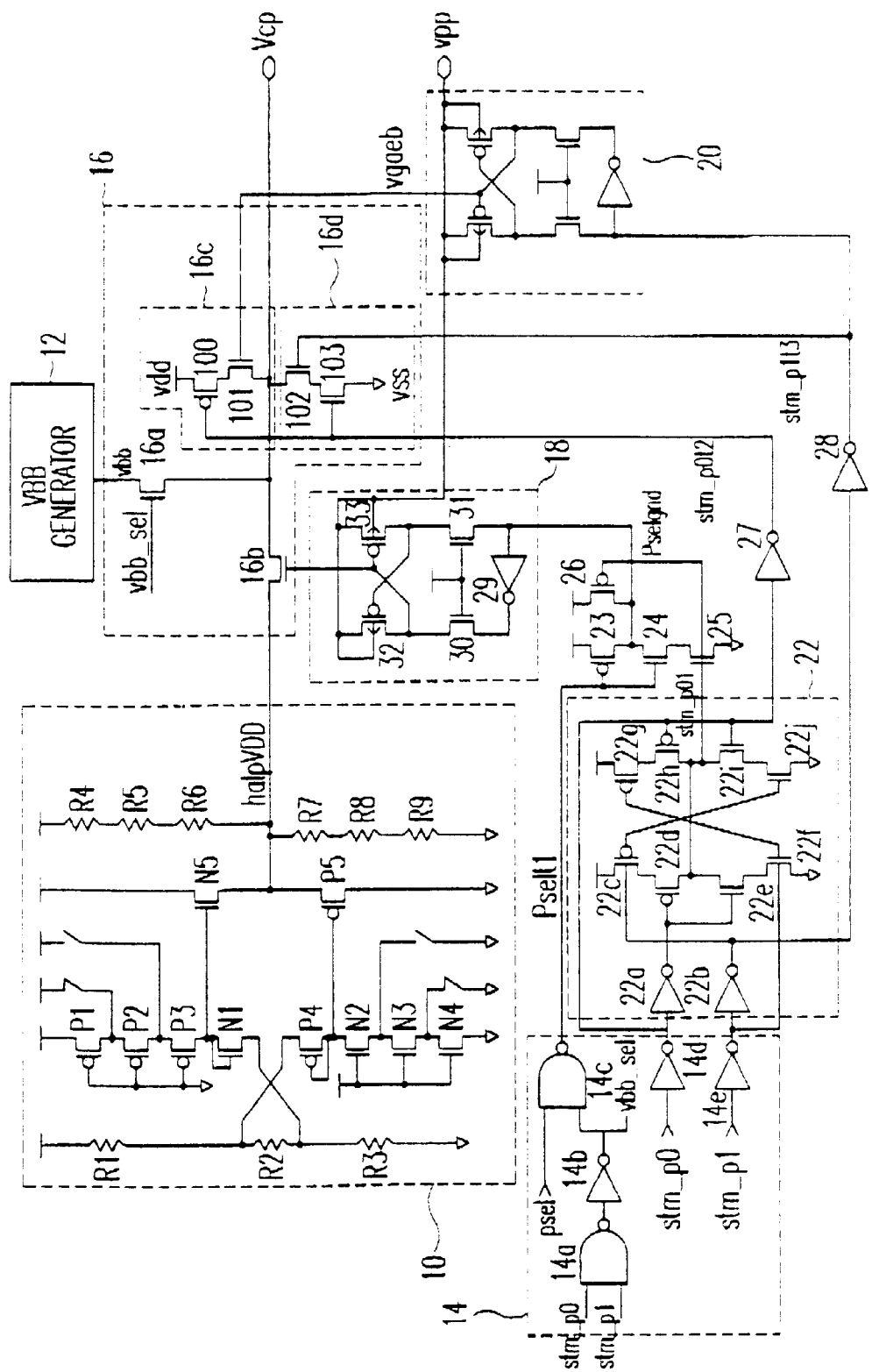
FIG. 3 provides a circuit diagram of the cell plate voltage generator in FIG. 2.

Referring to FIG. 3, there is shown a circuit diagram of the cell plate voltage generator in accordance with the embodiment of the present invention.

In FIG. 3, the half Vdd generation block 10 includes a plurality of resistors R1, R2 and R3 which are connected in series between a source voltage terminal and a ground voltage terminal; a multiplicity of PMOS transistors P1, P2 and P3 which are interconnected in series and whose gates are commonly attached to the ground voltage terminal; a diode-type NMOS transistor N1 established between the PMOS transistor P3 and the connection node of the resistors R2 and R3; a diode-type PMOS transistor P4 whose one part is joined to the connection node of the resistors R1 and R2; a multiplicity of NMOS transistors N2, N3 and N4 whose gates are commonly attached to the source voltage terminal and which are interconnected in series between the PMOS transistor P4 and the ground voltage terminal; an NMOS transistor N5 which has a gate connected to a node between the PMOS transistor P3 and the NMOS transistor N1 and a drain connected to the source voltage terminal; a PMOS transistor P5 whose gate is attached to a node between the PMOS transistor P4 and the NMOS transistor N5 and which is established between the NMOS transistor N5 and the ground voltage terminal; and a plurality of resistors R4 to R9 interconnected in series between the source voltage terminal and the ground voltage terminal. A common node connecting the NMOS transistor N5, the PMOS transistor PS and the resistors R6 and R7 is determined as an output terminal of the half Vdd generation block 10.

The cell plate selection block 14 includes a NAND gate 14a for logically combining specific test mode signals stm-p0 and stm-p1 by performing a NAND operation, wherein the specific test mode signals are used in selecting a voltage; an invertor 14b for inverting the output of the NAND gate 14a in order to provide the inverted output as a Vbb selection signal Vbb-sel; a NAND gate 14c for logically combining a signal Psel and the Vbb selection signal Vbb-sel coupled from the invertor 14b by performing the NAND operation, wherein the signal Psel is used in selecting the output voltage of the half vdd generation block 10; an invertor 14d for inverting the specific test mode signal stm-p0; and an invertor 14e for inverting the specific test mode signal stm-p1.

The transmission block 16 is composed of several MOS devices 16a to 16d. According to the control of the cell plate voltage selection block 14, the MOS device 16a transfers the Vbb voltage generated from the Vbb generation block 12 to the cell plate voltage terminal; the MOS device 16b, the Vdd/2 voltage produced from the half Vdd generation block 10; the MOS device 16c, the source voltage Vdd; and the MOS device 16d, the ground voltage Vss.

More specifically, the MOS devices 16a and 16b are NMOS transistors, respectively, and the MOS device 16c is a combined device of a PMOS transistor 100 and an NMOS transistor 101. The MOS device 16d is a combined device of two NMOS transistors 102 and 103.

In accordance with the embodiment of the present invention, in order to avert the voltage drop of a threshold voltage Vt of the NMOS transistors 16a to 16d, level shifters 18 and 20 are additionally employed in the cell plate voltage generator. In addition to this, an exclusive-OR circuit 22, several MOS devices 23 to 26 and invertors 27 and 28 are established between the cell plate selection block 14 and the level shifters 18 and 20.

The exclusive-OR circuit 22 contains an invertor 22a inverting the output of the invertor 14d in the cell plate voltage selection block 14; an invertor 22b inverting the output of the invertor 14e; a PMOS transistor 22d which has a gate attached to the output terminal of the invertor 22a and a source connected to the source voltage terminal via a PMOS transistor 22c; an NMOS transistor 22e which has a gate attached to the output terminal of the invertor 22a, a drain connected to a drain of the PMOS transistor 22d and a source joined to the source voltage terminal via an NMOS transistor 22f; a PMOS transistor 22g which has a gate attached to the output terminal of the invertor 14e with the gate of the NMOS transistor 22f and a source connected to the source voltage terminal; a PMOS transistor 22h which has a gate connected to the output terminal of the invertor 14d and a source joined to the source voltage terminal via the PMOS transistor 22g; an NMOS transistor 22i which has a gate attached to the output terminal of the invertor 14d and a drain connected to a drain of the PMOS transistor 22h; and an NMOS transistor 22j which has a gate connected to the output terminal of the invertor 22b with the gate of the PMOS transistor 22c and is equipped between the NMOS transistor 22i and the ground voltage terminal. A node, connecting the PMOS transistor 22d and the NMOS transistor 22e, and a node, joining the PMOS transistor 22h and the NMOS transistor 22, are interconnected and the interconnected node becomes an output terminal providing a signal stm-p01.

The output terminal Pselt1 of the NAND gate 14c in the cell plate voltage selection block 14 is commonly joined with gates of the PMOS and the NMOS transistors 23 and 24. The NMOS transistor 25 is equipped between the NMOS transistor 24 and the ground voltage terminal and its gate is attached to the output terminal of the exclusive-OR circuit 22. The signal stm-p01 generated from the exclusive-OR circuit 22 is provided to a gate of the PMOS transistor 26 which is combined with the PMOS transistor 23 in parallel.

The invertor 27 is located between the gate of the NMOS transistor 22i and the gates of the PMOS and the NMOS transistors 100 and 103. The invertor 28 is established between the output terminal of the invertor 22b and the gate of the NMOS transistor 102.

The level shifters 18 and 20 have an identical structure. For example, the level shifter 18 basically consists of an invertor 29 inverting a potential of a node Pseignd between the PMOS transistor 23 and the NMOS transistor 24; an NMOS transistor 30 which is connected to the node Pseignd via the invertor 29 and whose gate is attached to the source voltage terminal; an NMOS transistor 31 which is directly connected to the node Pseignd and whose gate is attached to the source voltage terminal; and PMOS transistors 32 and 33 which are connected between a voltage terminal Vpp and the NMOS transistors 30 and 31. In the above, a gate of the PMOS transistor 32 is attached between the PMOS transistor 33 and the NMOS transistor 31. A gate of the PMOS transistor 33 is connected between the PMOS transistor 32 and the NMOS transistor 30 and is also attached to the gate of the NMOS transistor 16b in the transmission block 16.

The difference of the level shifters 18 and 20 is that the level shifter 18 is coupled to the gate of the NMOS transistor 16b and the level shifter 20 is attached to the gate of the NMOS transistor 101.

Figure 4:
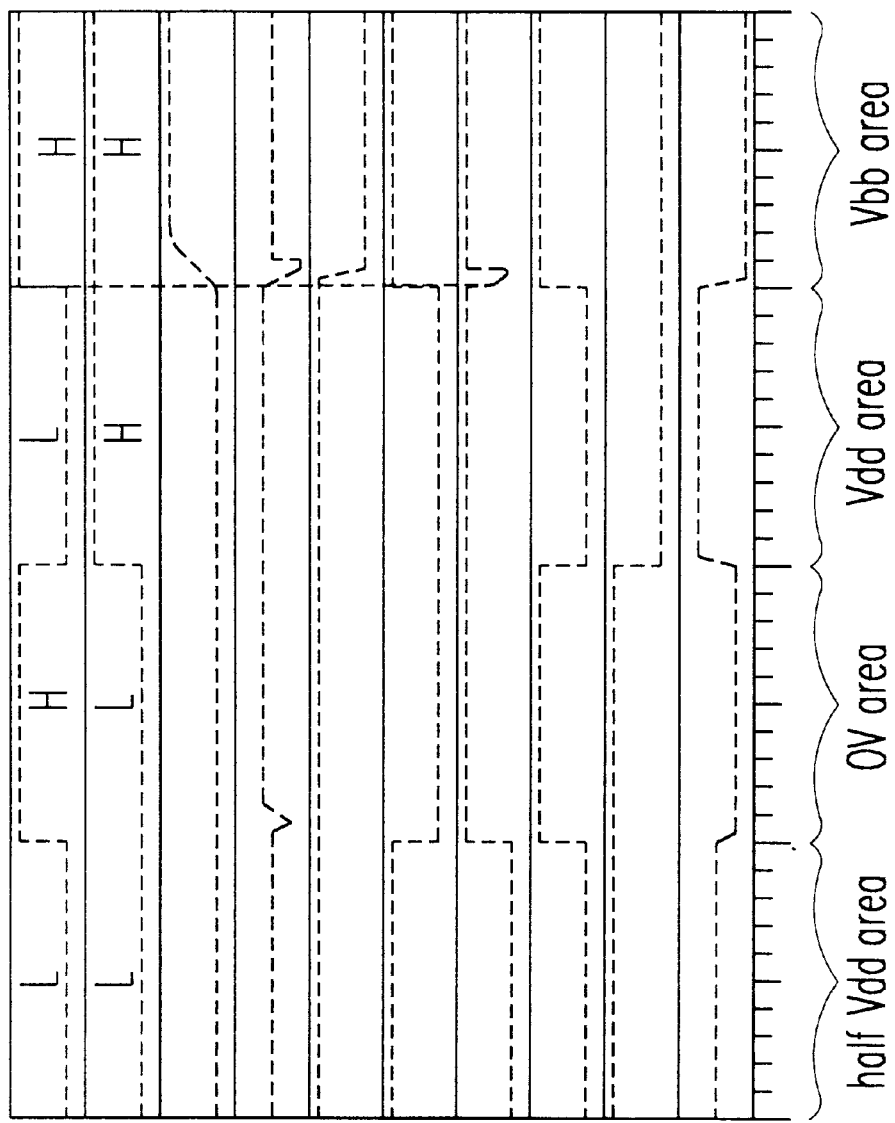
FIG. 4 is a timing diagram of signals provided by the cell plate voltage generator in FIG. 3.

Hereinafter, the operation of the cell plate voltage generator in accordance with the embodiment of the present invention will be illustrated referring to FIG. 4 representing a timing diagram of signals provided by the cell plate voltage generator.

First of all, when all of the specific test mode signals stm-p0 and stm-p1 fed to the the cell plate voltage selection block 14 are at a "low" level, the NAND gate 14a produces an output of a "high" level. The output of the NAND gate 14a is inverted to a "low" level by the invertor 14b and the inverted value is outputted through the output terminal Vbb-sel.

In the meantime, the half Vdd generation block 10 outputs a voltage of Vdd/2 via the output terminal halpVDD; the NAND gate 14 provides a signal of "Vdd" through the output terminal pselt1; and the exclusive-OR circuit 22 generates a signal of "Vdd" on the output terminal stm-p01.

Subsequently, since the PMOS transistors 23 and 26 are turned off, the node Pselgnd between the PMOS transistor 23 and the NMOS transistor 24 is at a "low" level; the output signal stm-p02 of the invertor 27 becomes a "low" level; and the output signal stm-p03 of the invertor 28 is converted to a "high" level.

Thereafter, the NMOS transistor 16b is turned on by the level shifter 18. Also, in response to the operation of the level shifter 20, the NMOS transistor 101 and the NMOS transistor 16a are turned off; the NMOS transistor 102 is turned on; and the NMOS transistor 103 is turned off. Therefore, when the specific test mode signals stm-p0 and stm-p1 fed to the cell plate voltage selection block 14 are at a "low" level, the output Vdd/2 of the half Vdd generation block 10 is inputted to the cell plate voltage terminal.

On the other hand, when the specific test mode signal stm-p0 is at a "high" level and the stm-p1 is at a "low" level, the NAND gate 14a produces an output signal of a "high" level and the output signal is inverted to a "low" level by the invertor 14b and then provided on the output terminal Vbb-sel.

At this time, the half Vdd generation block 10 provides a voltage of Vdd/2 via the output terminal halpVDD; the NAND gate 14c outputs an ouput signal of "Vdd" onto the ouput terminal pselt1; and the exclusive-OR circuit 22 supplies an output signal having 0V onto the output terminal stm-p01.

Then, since the PMOS transistors 23 and 26 are turned on, the node Pselgnd between the PMOS transistor 23 and the NMOS transistor 24 becomes a "high" level; the output signal stm-p02 of the invertor 27 is at a "high" level; and the output signal stm-p03 of the invertor 28 is changed to a "high" level.

Consequently, the NMOS transistor 16b is turned off by the level shifter 18; and by the operation of the level shifter 20, the NMOS transistor 101 is turned off and the NMOS transistors 102 and 103 are turned on. Thereafter, if the specific test mode signals stm-p0 and stm-p1 fed to the cell plate voltage selection block 14 are at "high" and "low" levels, respectively, the ground voltage Vss is provided to the cell plate voltage terminal.

In another case, if the specific test mode signal stm-p0 has a "low" level and the stm-p1 is at a "high" level, the NAND gate 14a generates an output signal at a "high" level and the output signal is inverted to a "low" level by the invertor 14b and then provided onto the output terminal Vbb-sel.

The half Vdd generation block 10 provides a voltage of Vdd/2 via the output terminal halpVDD; the NAND gate 14c outputs an ouput signal of "Vdd" onto the ouput terminal pselt1; and the exclusive-OR circuit 22 supplies an output signal having 0V onto the output terminal stm-p01.

In this case, since the PMOS transistor 26 is turned on while the PMOS transistor 23 is turned off, the node Pselgnd becomes a "high" level; the output signal stm-p02 of the invertor 27 is at a "low" level; and the output signal stm-p03 of the invertor 28 is transformed to a "low" level.

As a result, since the PMOS transistor 100 is turned on; the NMOS transistor 16b is turned off by the level shifter 18; the NMOS transistor 16a is turned off; the NMOS transistor 101 is turned on by the level shifter 20; and the NMOS transistors 102 and 103, when the specific test mode signals stm-p0 and stm-p1 fed to the cell plate voltage selection block 14 are at "low" and "high" levels, respectively, the source voltage Vdd is supplied to the cell plate voltage terminal.

Finally, when performing a burn-in test, i.e., when all of the specific test mode signals stm-p0 and stm-p1 fed to the the cell plate voltage selection block 14 are at a "high" level, the NAND gate 14a produces an output of a "low" level. The output of the NAND gate 14a is inverted to a "high" level by the invertor 14b and then outputted onto the output terminal Vbb-sel.

Meanwhile, the half Vdd generation block 10 produces a voltage of Vdd/2 onto the output terminal halpVDD; the NAND gate 14 provides a signal of "0V" through the output terminal pselt1; and the exclusive-OR circuit 22 generates a signal of "Vdd" via the output terminal stm-p01.

Then, since the PMOS transistors 23 is turned on the PMOS transistor 26 is turned off; and when the NMOS transistor 24 is turned off, the node Pselgnd becomes a "high" level; the output signal stm-p02 of the invertor 27 is changed to a "high" level; and the output signal stm-p03 of the invertor 28 is converted to a "low" level.

Thereafter, the NMOS transistor 16b is turned off by the level shifter 18. Also, the NMOS transistor 101 is turned on by the level shifter 20; the NMOS transistor 100 is turned off; the NMOS transistor 16a is turned on; and the NMOS transistor 102 is turned off. As a result, when the specific test mode signals stm-p0 and stm-p1 fed to the cell plate voltage selection block 14 are at a "high" level, the voltage Vdd derived from the Vbb generation block 12 is transferred to the cell plate voltage terminal.

As illustrated above, in accordance with the present invention, the cell plate potential can have one of Vdd/2, 0V, Vdd and Vbb according to its purpose. Also, when performing the burn-in test, it is possible to supply the Vbb as the cell plate potential Vcp. Thereafter, by increasing the burn-in voltage stress from the conventional several hundred mV to at least 1500 mV, an advanced voltage acceleration effect is achieved.

In addition, since the voltage acceleration increases by quadruple to quintuple, it is possible to reduce the time required for the burn-in test by ¼ to ⅕ times compared to the conventional method.

While the present invention has been described with respect to the particular embodiments, it will be apparent to those skilled in the art that various changes and modifications may be made without departing from the spirit and scope of the invention as defined in the following claims.

What is claimed is:

1. A cell plate voltage generator of a semiconductor memory device, comprising:

a half Vdd generation means for producing a half voltage having a half of an external potential inputted from outside of the semiconductor memory device;

a Vbb generation means for generating a negative voltage;

a first terminal applied a source voltage to;

a second terminal applied the ground voltage to;

a cell plate voltage selection means for generating a plurality of control signals;

a plurality of transmission means for delivering selectively the half voltage, the negative voltage, the source voltage and the ground voltage in accordance with the control signals; and a level shifter for level shifting at least two of the control signals in order to avert a voltage drop in threshold voltages of the transmission means.

2. The cell plate voltage generator as recited in claim 1, wherein said transmission means comprises a switching means.

3. The cell plate voltage generator as recited in claim 2, wherein the switching means comprises a MOS transistor.

4. The cell plate voltage generator as recited in claim 2, wherein the switching means comprises a PMOS transistor and an NMOS transistor.

5. The cell plate voltage generator as recited in claim 1, wherein the cell plate voltage selection means further comprises a logic circuit for controlling the transmission means to transmit the half voltage and the negative voltage.

6. The cell plate voltage generator as recited in claim 5, wherein the logic circuit comprises an exclusive-OR circuit.

* * * * *